United States Patent
Kurita

[11] Patent Number: 5,936,441
[45] Date of Patent: *Aug. 10, 1999

[54] CLOCK PULSE GENERATOR

[75] Inventor: Kozaburo Kurita, Ome, Japan

[73] Assignee: Hitachi, Ltd., Tokyo, Japan

[*] Notice: This patent is subject to a terminal disclaimer.

[21] Appl. No.: 08/857,202

[22] Filed: May 15, 1997

Related U.S. Application Data

[63] Continuation of application No. 08/555,322, Nov. 8, 1995, Pat. No. 5,638,014.

[30] Foreign Application Priority Data

Nov. 11, 1994 [JP] Japan ................................. 6-301691

[51] Int. Cl.$^6$ ....................................................... H03L 7/00
[52] U.S. Cl. ........................... 327/141; 327/154; 327/362
[58] Field of Search ....................................... 317/141, 144, 317/145, 146, 147, 148, 149, 150, 154, 155, 156, 158, 159, 362; 331/17, 57

[56] References Cited

U.S. PATENT DOCUMENTS 5,638,014 6/1997 Kurita ........................................ 327/141

FOREIGN PATENT DOCUMENTS

A-2-230821 9/1990 Japan .

OTHER PUBLICATIONS

M. Johnson et al., "A Variable Delay Line PLL for CPU–Coprocessor Synchronization", IEEE Journal of Solid–State Circuit, vol. 23, No. 5, Oct. 1988, pp. 1218–1223.

D. Jeong et al., "Design of PLL–Based Clock Generation Circuits", IEEE Journal of Solid–State Circuit, vol. SC–22, No. 2, Apr. 1987, pp. 255–261.

Primary Examiner—Timothy P. Callahan
Assistant Examiner—Jeffrey Zweizig
Attorney, Agent, or Firm—Antonelli, Terry, Stout & Kraus, LLP

[57] ABSTRACT

A simply structured clock pulse generator operating stably in a wide range of frequencies in response to a timing signal fed from outside a semiconductor integrated circuit. A first frequency signal fed from the external terminal of the semiconductor integrated circuit and a second frequency signal generated within the semiconductor integrated circuit are input to a phase comparator. The output signal of the phase comparator is smoothed by a low-pass filter for conversion to a voltage signal. A compensation circuit uses both a delay signal from a current-controlled delay circuit receiving the first frequency signal and the first frequency signal to generate a current signal corresponding to the frequency of the latter signal. The voltage signal generated by the low-pass filter is converted into a current signal. This current signal is combined with the current signal from the compensation circuit to control the oscillation frequency of a ring oscillator comprising a current-controlled delay circuit the same in structure as the above current-controlled delay circuit. On the basis of the oscillation signal from the ring oscillator, the second frequency signal and clock signals needed in the semiconductor integrated circuit are generated.

9 Claims, 11 Drawing Sheets

CHARACTERISTIC OF THE RING OSCILLATOR

VB-Iv CHARACTERISTIC

Ic-Iv CHARACTERISTIC

CHARACTERISTIC OF THE COMPENSATION CIRCUIT

CHARACTERISTIC OF THE PLL

CLOCK PULSE GENERATOR

This is a continuation of application Ser. No. 08/555,322, filed Nov. 8, 1995, now U.S. Pat. No. 5,638,014.

BACKGROUND OF THE INVENTION

The present invention relates to a clock pulse generator and, more particularly, to a clock pulse generator which is incorporated in a CMOS (complementary metal oxide semiconductor) integrated circuit device and which generates clock signals in synchronism with an externally supplied timing signal.

The inventors of the present invention have proposed in Japanese Patent Laid-Open No. Hei 2-230821 a clock pulse generator having compensating means for varying the range of oscillated frequencies of a VCO (voltage-controlled oscillator) constituting part of a PLL circuit, with respect to the frequency of a timing signal fed from an external terminal. Equipped with its compensating means, the proposed clock pulse generator generates clock signals in a stable manner over a wide range of frequencies.

SUMMARY OF THE INVENTION

In the above-mentioned clock pulse generator, the VCO is composed of an emitter-coupled multivibrator combined with a bipolar transistor and MOSFET (metal-oxide semiconductor field-effect transistor) arrangement, and the compensation means is made up of a frequency-current converter that utilizes an integrating circuit set and reset by the timing signal. Because the component bipolar transistors and MOSFETs need to be formed on the same semiconductor substrate, the process of manufacturing the clock pulse generator has become complicated. In addition, the inventors found, the compensation means and the VCO are individually affected by process-induced disparities in device characteristics, with the result that the operating range of the clock pulse generator as a whole is practically limited.

It is therefore an object of the present invention to provide a simply structured clock pulse generator operating stably in a wide range of frequencies in response to the timing signal (frequency signal) fed from outside the semiconductor integrated circuit.

Other objects, features and advantages of the present invention will become apparent in the following specification and accompanying drawings.

In carrying out the invention and according to one aspect thereof, there is provided a clock pulse generator formed in a semiconductor integrated circuit on a semiconductor substrate. This clock pulse generator comprises a compensation circuit including: a phase comparator for detecting a phase difference between a timing signal fed from an external terminal of the semiconductor integrated circuit and a clock signal generated within the semiconductor integrated circuit, and for outputting an output signal derived from the phase difference; a low-pass filter for smoothing the output signal of the phase comparator for conversion into a voltage signal; and a first current-controlled delay circuit for generating a delay signal of the timing signal. Thus constituted, the compensation circuit uses the timing signal and the delay signal to generate a first current signal corresponding to the frequency of the timing signal. The clock pulse generator further comprises: a voltage-current conversion circuit for converting the voltage signal generated by the low-pass filter into a second current signal, and for generating a third current signal on the basis of the first and the second current signal; and a ring oscillator which, controlled by the third current signal, generates the clock signal by use of a second current-controlled delay circuit having the same circuit constitution as that of the first current-controlled delay circuit.

In the clock pulse generator of the above constitution, the ring oscillator located in the PLL setup employs the current-controlled delay circuit of the same structure as that in the compensation circuit for controlling the operating range of the ring oscillator. The constitution offers enhanced compatibility between the component circuits and thus drastically reduces process-induced characteristic disparities between the generator components. This makes it possible for the inventive clock pulse generator to utilize circuits as structurally simple as CMOS circuits.

DESCRIPTION OF THE PREFERRED EMBODIMENTS

Figure 1:
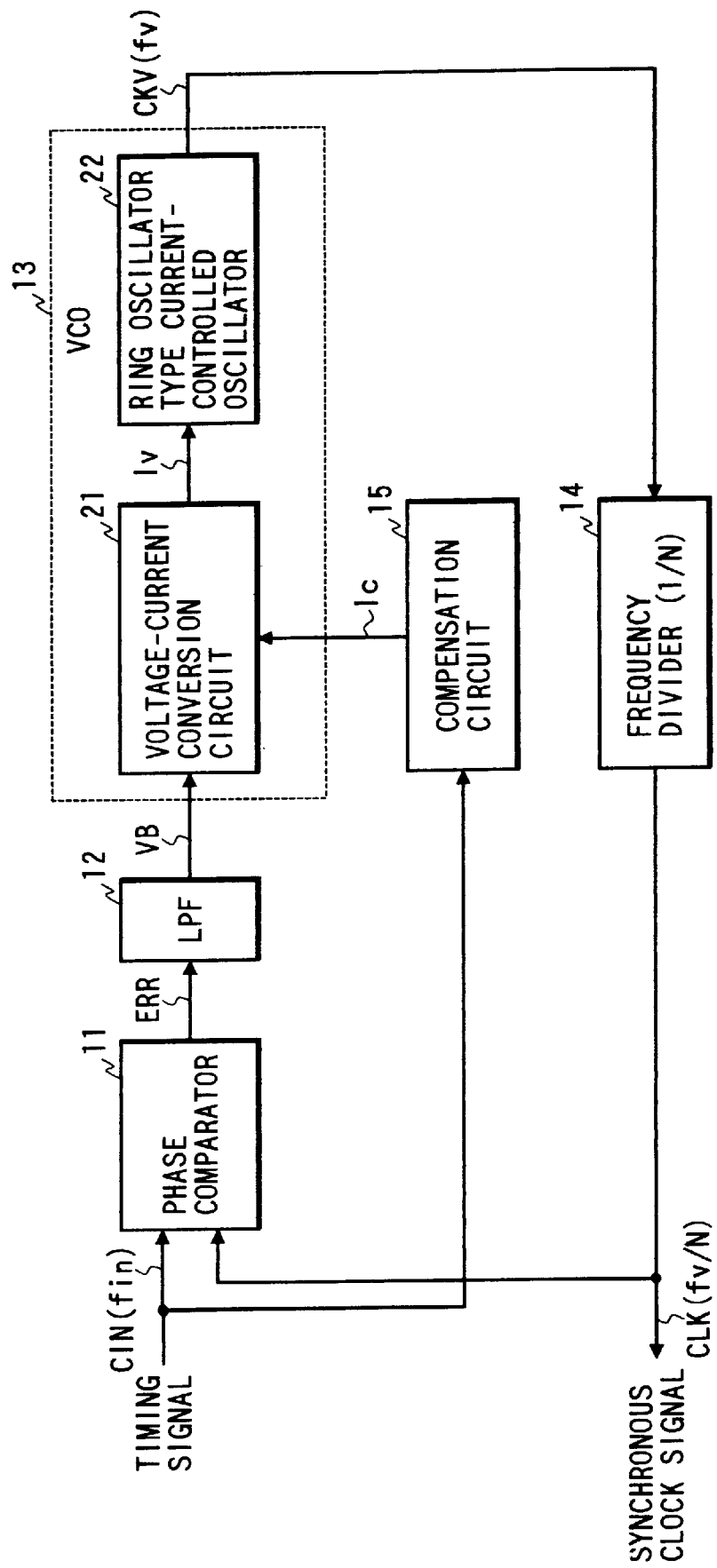
FIG. 1 is a block diagram of a clock pulse generator practiced as an embodiment of the invention.

FIG. 1 is a block diagram of a clock pulse generator practiced as one embodiment of the invention. The circuit blocks shown in FIG. 1 are formed along with other internal circuits, not shown, by known CMOS integrated circuit fabrication techniques on a single semiconductor substrate made illustratively of single crystal silicon.

A timing signal CIN (fin) is a frequency signal fed from an external terminal of the semiconductor integrated circuit. The timing signal thus supplied enters one of the two input terminals, not shown, of a phase comparator 11. The other input terminal of the phase comparator 11 is supplied with a synchronizing clock signal CLK (fv/N) generated by the clock pulse generator of the invention. In turn, the phase comparator 11 detects a phase difference between the timing signal CIN (fin) and the synchronizing clock signal CLK (fv/N) and outputs an error signal ERR corresponding to that phase difference. The error signal ERR generated by the phase comparator 11 is smoothed by a low-pass filter LPF for conversion into a control voltage signal VB. The control voltage signal VB is converted to a current signal Iv by a voltage-current conversion circuit 21 constituting part of a VCO 13. The current signal Iv is used to control the oscillation frequency of a ring oscillator type current-controlled oscillator 22 (also called the ring oscillator hereunder). The output signal CKV (fv) of the ring oscillator 22 is divided by a frequency divider 14 into 1/N. The divided ring oscillator output is supplied as the synchronizing clock signal CLK (fv/N) to the internal circuits, not shown, and serves as the internal frequency signal entering the phase comparator 11. The components above make up a PLL circuit.

The embodiment outlined above is practiced as a clock pulse generator to be incorporated in a semiconductor integrated circuit composed of CMOS circuits. The VCO 13 thus utilizes a ring oscillator type current-controlled oscillator 22 that is readily implemented by use of CMOS circuits. The ring oscillator 22 is furnished with a compensation circuit 15 for two purposes: to allow for large process-induced disparities in device characteristic (as much as ±30%) with respect to the design values, and to facilitate debugging at the design stage using clock frequencies much lower than those of normal operation, as will be described below.

The basic operation of the compensation circuit 15 is the same as that of the compensation means proposed by the inventors in the above-cited Japanese Patent Laid-Open No. Hei 2-230821. That is, the compensation circuit 15 varies the operating range of the VCO 13 by detecting the frequency of the timing signal CIN (fin). In this setup, it is necessary to compensate those process-induced characteristic disparities of the ring oscillator 22 as mentioned above. This requires making suitable arrangements in the frequency-current conversion circuit used by the compensation circuit 15.

With this invention, the process-induced characteristic disparities of each of the devices in the semiconductor integrated circuit may be significantly large but the devices are subject to the same kind of process-induced disparities. This means that ultimately the relative disparities in characteristic are small between the devices. In this respect, the ring oscillator 22 utilizes the delay circuit of the same structure as that in the compensation circuit 15.

Figure 2:
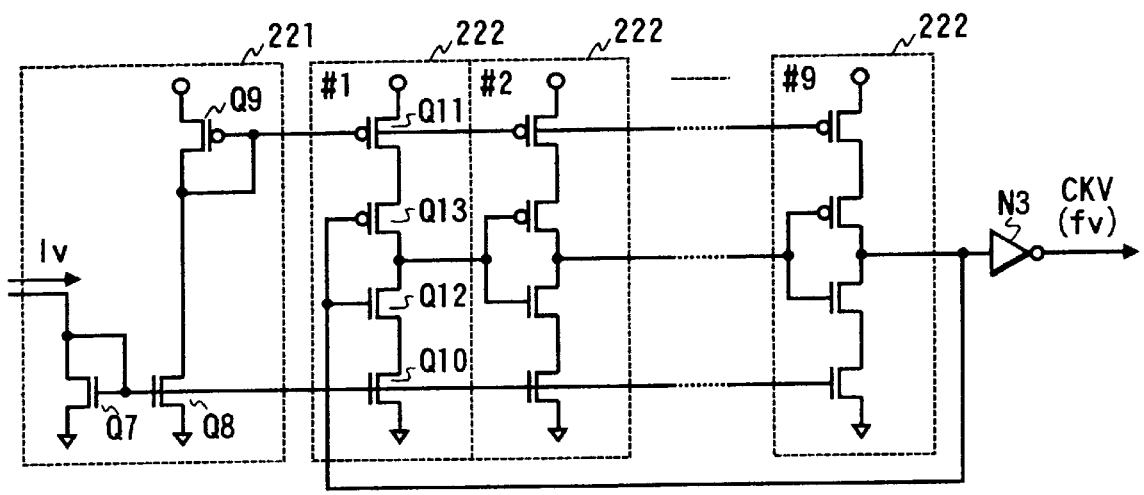
FIG. 2 is a circuit diagram of a ring oscillator constituting part of the VCO in FIG. 1.

FIG. 2 is a circuit diagram of the ring oscillator 22 constituting part of the VCO 13 in FIG. 1. The VCO 13 of this example is made structurally as simple as CMOS circuits, i.e., simple enough to be incorporated unmodified into a semiconductor integrated circuit made up of CMOS circuits. The requirement of structural simplicity is met by use of a ring oscillator composed of CMOS circuits. The ring oscillator 22 has the same constitution as the current-controlled delay circuit in the compensation circuit 15, as will be described later.

The control current Iv for control of the oscillation frequency is fed to a control current circuit 221 composed of an current mirror circuit including n-channel MOSFETs Q7 and Q8. The n-channel MOSFET Q7 is in current mirror relation to n-channel MOSFETs Q10 making up part of delay gate circuits 222. The drain terminal of the n-channel MOSFET Q8 is connected to a p-channel MOSFET Q9 of diode form. The MOSFET Q9 is in current mirror relation to p-channel MOSFETs Q11 constituting part of the delay gate circuits 222. In this setup, the n-channel MOSFETs Q10 and p-channel MOSFETs Q11 operate as variable current sources allowing currents to flow as per the control current Iv.

Each of the delay gate circuits 222, as typically shown in the circuit #1 of FIG. 2, has an n-channel MOSFET Q12 and a p-channel MOSFET Q13 connected serially between the n-channel MOSFET Q10 and the p-channel MOSFET Q11, the latter two operating as variable current sources. The arrangement causes the operating current of the CMOS inverter circuit to be determined by the n-channel MOSFET Q10 and p-channel MOSFET Q11 working as the variable current sources. The output signal of the most-downstream (#9) delay gate circuit 222 is fed back to the commonly connected gate of the above MOSFETs Q12 and Q13. The commonly connected drain terminal of the MOSFETs Q12 and Q13 is connected to an input terminal (gate terminal) of the next-downstream (#2) CMOS inverter circuit of the same structure. A total of nine delay gate circuits are connected in a ring-like serial manner to effect oscillation.

The control current Iv is substantially in inverse proportion to the delay gate circuits 222 in terms of delay time tpv, given by the expression:

$$tpv = 1/(a0 \cdot Iv) \quad (1)$$

where, a0 is a constant. Since the embodiment above uses a nine-stage ring oscillator arrangement (#1–#9), the oscillation frequency fv is given as $1/(18 \cdot tpv)$. Inserting that oscillation frequency into the expression (1) above provides:

$$fv = (a0 \cdot Iv)/18 \quad (2)$$

so that the oscillation frequency fv is in proportion to the control current Iv.

Figure 3:
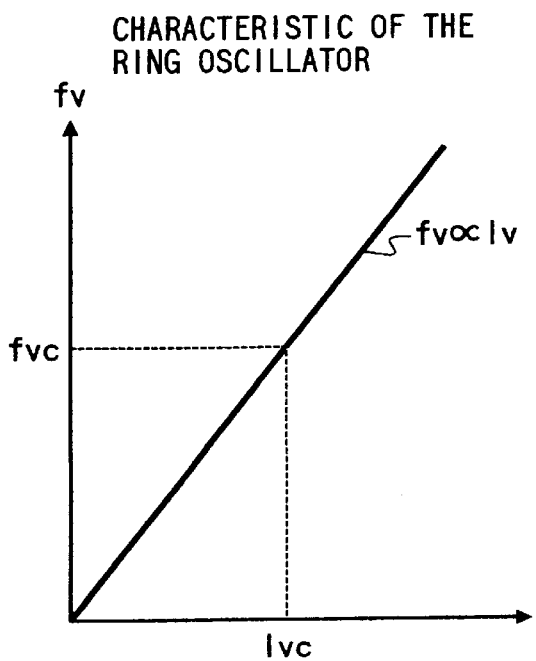
FIG. 3 is a graphic representation of a current-frequency characteristic of the ring oscillator in FIG. 2.

FIG. 3 is a graphic representation of a current-frequency characteristic of the above-described ring oscillator. As mentioned, the control current Iv is substantially in inverse proportion to the delay gate circuits 222 in terms of delay time tpv. Because the delay time tpv is also substantially in inverse proportion to the oscillation frequency fv, ultimately the oscillation frequency fv is made substantially proportional to the control current Iv when suitably controlled. In FIG. 3, reference characters fvc stand for a center frequency, and a current Ivc is the control current that corresponds to that center frequency.

Figure 4:
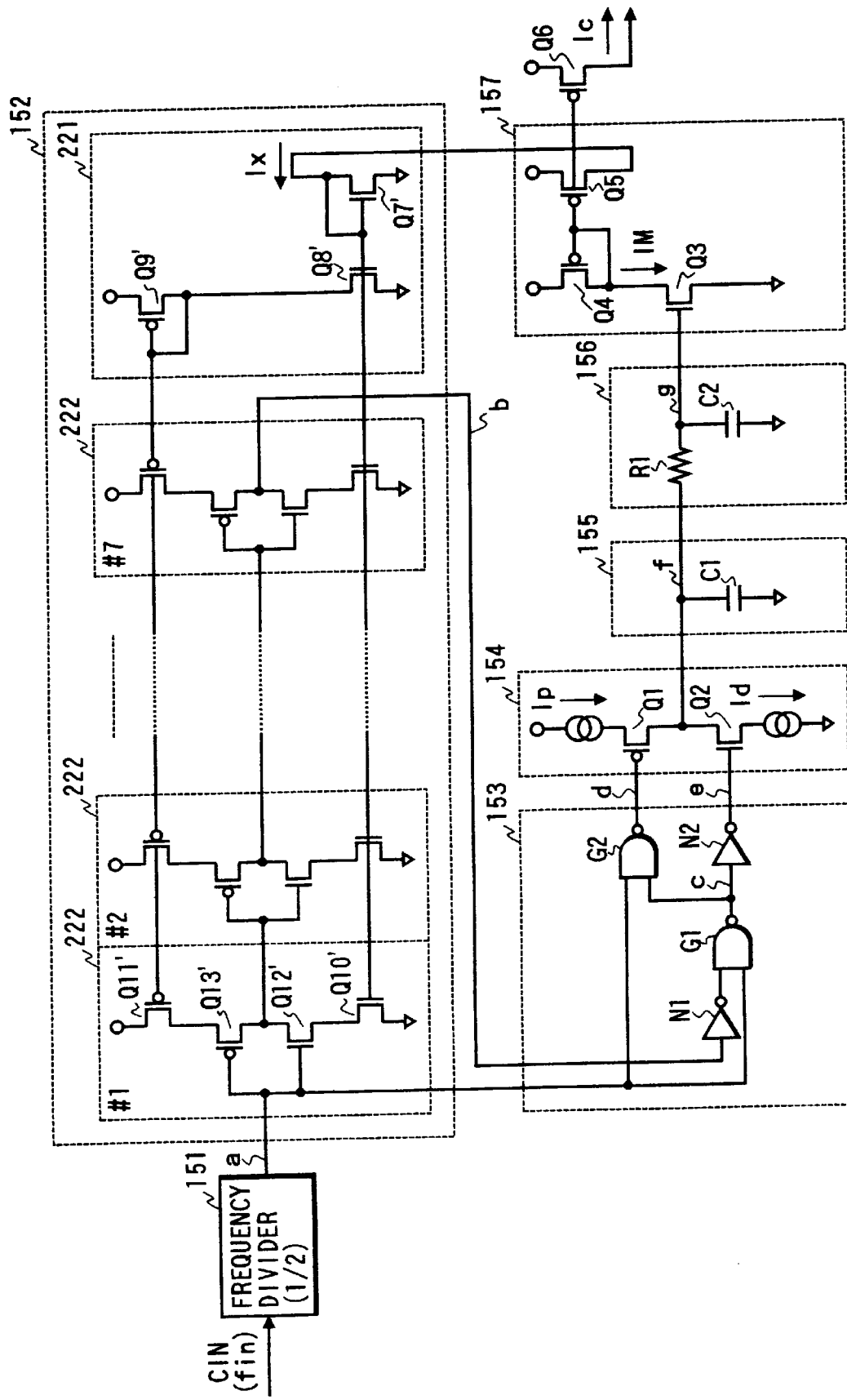
FIG. 4 is a circuit diagram of a typical compensation circuit included in FIG. 1.

FIG. 4 is a circuit diagram of a typical compensation circuit 15 that may be included in FIG. 1. The timing signal CIN is halved by a frequency divider 151. With the pulse width duty factor cut by 50%, the original timing signal is converted to a pulse signal "a," to be accepted and delayed by a current-controlled delay circuit 152. The delayed pulse signal "b" from the current-controlled delay circuit 152 is input along with the pulse signal "a" to a logic circuit 153. The logic circuit 153 comprises NAND gate circuits G1 and G2 and inverter circuits N1 and N2. A pulse signal "d" corresponding to the delay time of the delay circuit 152 is produced, and a pulse signal "e" is generated by subtracting the time of the pulse signal "d" from one cycle of the timing signal CIN.

In other words, the logic circuit 153 turns on a p-channel MOSFET Q1 of a charge pump circuit 154 using the pulse signal "d" corresponding to the delay time of the delay circuit 152 during one cycle of the timing signal CIN. This causes a constant current source Ip to charge up a capacitor (C1) 155. The logical circuit 153 also turns on an n-channel MOSFET Q2 of the charge pump circuit 154 using the pulse signal "e" corresponding to the remaining time. This causes a constant current source Id to discharge the capacitor (C1) 155. Since the timing signal CIN has been halved by the frequency divider 151, the charge-up and discharge operation is carried out every two cycles of the timing signal CIN. That is, following each charge-up and discharge operation in one cycle, the capacitor 155 retains the same charge state during the next cycle.

A voltage signal "f" from the capacitor 155 is smoothed by a low-pass filter 156 composed of a resistor R1 and a capacitor C2. An output voltage "g" from the low-pass filter 156 enters a voltage-current conversion circuit 157 for conversion into a current signal IM. Specifically, the voltage signal "g" enters the gate terminal of an n-channel MOSFET Q3, to be converted to the current signal IM via the drain terminal thereof. The current signal IM is separated into two outputs by a current mirror circuit made up of p-channel MOSFETs Q4, Q5 and Q6. One separated output is a control current Ix sent to the delay circuit 152 via the MOSFET Q5; the other output is a compensation current Ic forwarded to the VCO 13 via the MOSFET Q6.

The control current Ix is fed to the control current circuit 221 composed of a current mirror circuit including n-channel MOSFETs Q7' and Q8', similar to those of the ring oscillator in FIG. 2. The MOSFET Q7' is in current mirror relation to n-channel MOSFETs Q10' constituting part of the delay gate circuits 222. The drain terminal of the MOSFET Q8' is connected to a p-channel MOSFET Q9' of diode form. The MOSFET Q9' is in current mirror relation to p-channel MOSFETs Q11' constituting part of the delay gate circuits 222. In this setup, the n-channel MOSFETs Q10' and p-channel MOSFETs Q11' operate as variable current sources allowing currents to flow as per the control current Ix.

Each of the delay gate circuits 222, as typically shown in the circuit #1 of FIG. 4, has an n-channel MOSFET Q12' and a p-channel MOSFET Q13' connected serially between the n-channel MOSFET Q10' and the p-channel MOSFET Q11', the latter two operating as variable current sources. The arrangement causes the operating current of the CMOS inverter circuit to be determined by the n-channel MOSFET Q10' and p-channel MOSFET Q11' working as the variable current sources. The commonly connected gate terminal of the MOSFETs Q12' and Q13' is supplied with the pulse signal "a" divided by the frequency divider 151. The commonly connected drain terminal of the MOSFETs Q12' and Q13' is connected to an input terminal of the next-downstream (#2) CMOS inverter circuit of the same structure.

The delay gate circuit (#1) drives a capacitive load consisting of the gate and line capacities of the above-described p-channel and n-channel MOSFETs. By charging up and discharging the capacitive load using the operating current, the delay gate circuit functions as an equivalent delay circuit. With the operating current varied in accordance with the control current Ix, the delay gate circuit works as a current-controlled delay circuit. In this embodiment, the delay gate circuit 22 includes, and is not limited to, a total of even delay gate circuits (#1–#7) connected serially to generate the delay pulse signal "b."

The delay time tpx of the delay gate circuits 222 is controlled by the control current Ix so as to keep constant the ratio of the cycle (1/fin) of the timing signal CIN to the delay time t1 provided by the delay circuits. The compensation current Ic is generated in keeping with the cycle of the timing signal CIN, i.e., the frequency fin. In that case, when the frequency fin is made high, the control current Ix and compensation current Ic are both enlarged so as to shorten the cycle (1/fin) and reduce the delay time tpx of the delay gate circuits 222. Conversely, when the frequency fin is made low, the control current Ix and compensation current Ic are both reduced to prolong both the cycle (1/fin) and the delay time tpx of the delay gate circuits 222. In this manner, the compensation circuit 15 converts the frequency of the input signal CIN into current signals.

The compensation current Ic is used by the voltage-current conversion circuit 21 to determine the center frequency fvc of the ring oscillator 22 acting practically as the VCO, as will be discussed below. Because the delay gate circuit for practically performing frequency-current converting operations and the delay gate circuit for determining the oscillation frequency of the ring oscillator are structurally the same within the compensation circuit 15, the control currents Ix and Iv maintain a virtually constant relation to each other without being affected by process-induced disparities in device characteristics. Thus the correlation between the compensation current Ic fed to the VCO and the oscillation center frequency fvc is the same as that between the compensation current Ic and the frequency fin of the timing signal CIN in the compensation circuit 15, regardless of varying conversion constants. This keeps the timing signal fin and the oscillation center frequency fvc in proportional relation to each other. In the manner described, the compensation circuit 15 keeps the center frequency fvc of the operating range of the VCO 13 in proportion to the frequency fin of the timing signal CIN entered through the external terminal.

In the PLL-based clock pulse generator in its phase-locked state, the frequency fin of the entered timing signal CIN remains always proportional to the frequency fv of the oscillation output CKV from the VCO 13 (i.e., fin=fv/N, where N is the division ratio of the loop). If the proportional constant regarding the frequency fin and oscillation output fv is made the same as that for the frequency fin of the compensation circuit 15 and for the oscillation center frequency fvc of the VCO 13, the oscillation output fv coincides with the output fvc. That is, although the frequency fin of the timing signal CIN entered via the external terminal of the semiconductor integrated circuit varies or contains process-induced characteristic disparities, the VCO 13 always operates in keeping with the center frequency fvc of its operating range for oscillation.

Figure 5:
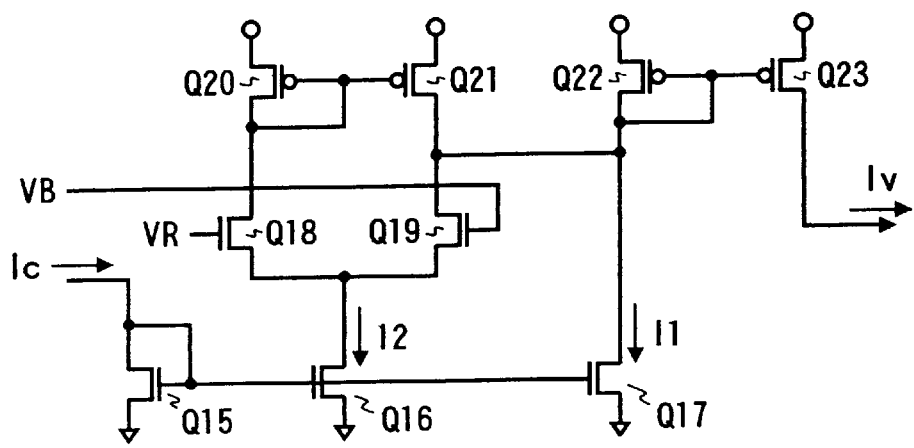
FIG. 5 is a circuit diagram of a typical voltage-current conversion circuit included in the VCO of FIG. 1.

FIG. 5 is a circuit diagram of a typical voltage-current conversion circuit 21 that may be included in the VCO 13 of FIG. 1. The control voltage VB generated by the low-pass filter 12 in the PLL and a reference voltage VR are fed respectively to n-channel different MOSFETs Q19 and Q18. The commonly furnished source terminal of the differential MOSFETs Q18 and Q19 is connected to an n-channel MOSFET Q16 generating a current I2. The MOSFET Q16 is in current mirror relation to an n-channel MOSFET Q15 of diode form to which the compensation current Ic generated by the compensation circuit 15 is input. In this setup, the current I2 is generated in accordance with the size ratio (a2) of the MOSFET Q15 to MOSFET Q16 in their current mirror form (i.e., I2=a2·Ic).

The drain terminals of the differential MOSFETs Q18 and Q19 are connected respectively to p-channel MOSFETs Q20 and Q21 in current mirror relation to each other. A drain current from the differential MOSFET Q18 flows through the MOSFETs Q20 and Q21 in their current mirror form to the drain terminal of the other differential MOSFET Q19. Thus when the control voltage VB is equal to the reference voltage VR, the same current of I2/2 flows through the drain terminals of the differential MOSFETs Q18 and Q19. This sets the output node current to zero. When the control voltage VB is made high to turn on the MOSFET Q19 and turn off the MOSFET Q18, the current I2 flows through the MOSFET Q19 and the output node thereof generates a sink current such as −I2. When the control voltage VB is made low to turn on the MOSFET Q18 and turn off the MOSFET Q19, the current I2 flows through the MOSFET Q18 and the output node thereof generates a source current such as +I2 via the current mirror circuit above.

The MOSFET Q15 receiving the compensation current Ic is furnished with an n-channel MOSFET Q17 in current mirror relation thereto. The drain terminal of the MOSFET Q17 is connected to a p-channel MOSFET Q22 of diode form. A current combining the current I1 generated by the MOSFET Q17 with the output current of the above-described differential circuit flows through the MOSFET Q22. This causes a p-channel MOSFET 23 in current mirror relation to the p-channel MOSFET Q22 to generate an output current Iv corresponding to the above current I1±I2. The current I1 is generated in accordance with the size ratio (a1) of the MOSFET Q15 to MOSFET Q17 in current mirror relation to each other (i.e., I1=a1·Ic).

Figure 6A:
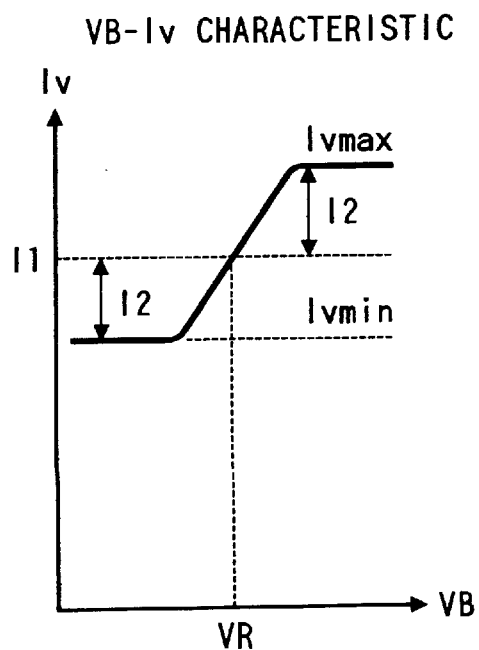
FIG. 6A is a graphic representation of a VB-Iv characteristic reflecting how the voltage-current conversion circuit of FIG. 5 operates.
Figure 6B:
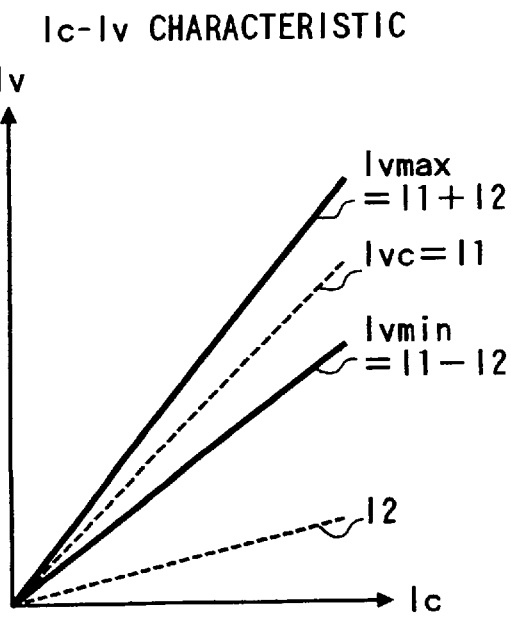
FIG. 6B is a graphic representation of an Ic-Iv characteristic reflecting how the voltage-current be conversion circuit of FIG. 5 operates.

FIGS. 6A and 6B are graphic representations of characteristics reflecting how the voltage-current conversion circuit 21 operates. FIG. 6A gives a VB-Iv characteristic showing how a positive or negative change of the control voltage VB relative to the reference voltage VR entails a corresponding change in the distribution ratio of the current I2, and how a current reflecting the difference with respect to the reference is overlaid on (i.e., combined with) the current I1 to generate the output current Iv. FIG. 6B gives an Ic-Iv characteristic indicating how the currents I1 and I2 change together in proportion to the compensation current (control signal) Ic generated by the compensation circuit. The current I1 establishes the center control current Ivc, whereas the current I2 sets a maximum value Ivmax and a minimum value Ivmin of the operating range corresponding to the control voltage VB of the PLL.

Figure 7:
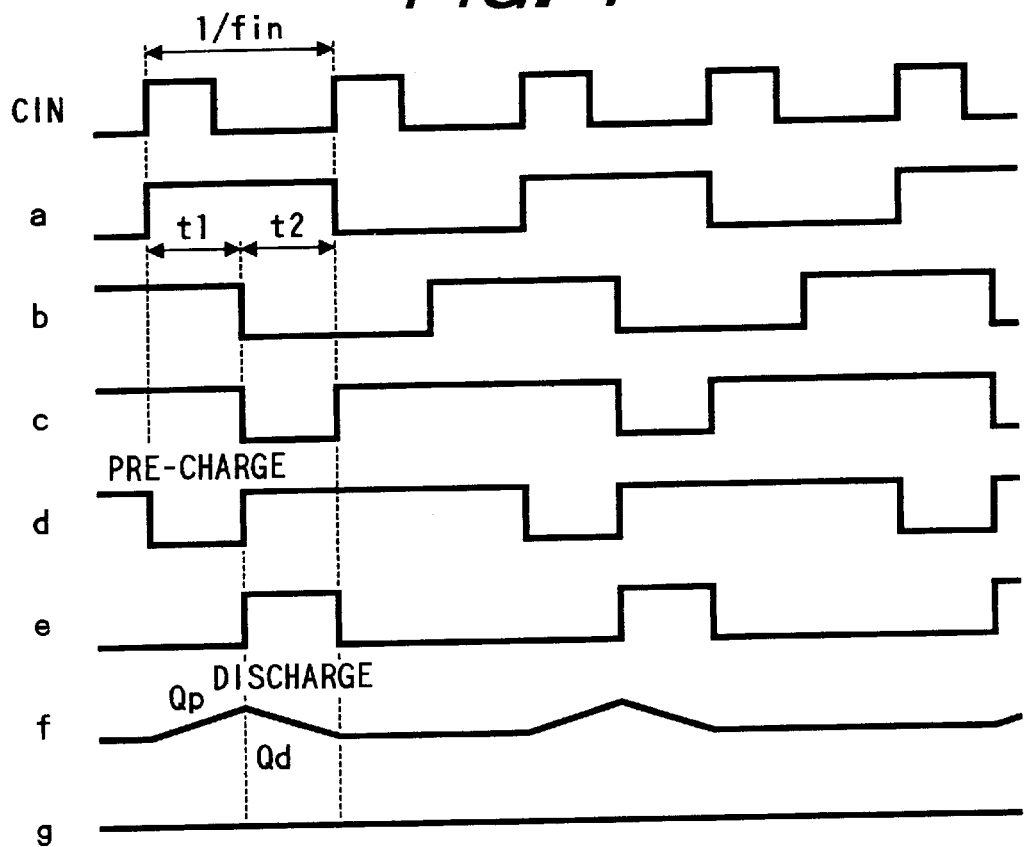
FIG. 7 is a waveform chart for explaining how the compensation circuit of FIG. 2 operates.

FIG. 7 is a waveform chart for explaining how the compensation circuit of FIG. 4 operates. The timing signal CIN is halved by the frequency divider 151 to generate the pulse signal "a" having the pulse width duty factor corresponding to one cycle of the timing signal CIN. The pulse signal "a" is input to the current-controlled delay circuit 152 to generate the delayed pulse signal "b." Given the two pulse signals "a" and "b," the logic circuit 153 generates the pulse signals "d" and "e." The pulse signal "d" is brought Low during the delay time t1, and the pulse signal "e" is driven High during a time t2 obtained by subtracting the delay time t1 from one cycle of the timing signal CIN. A pulse signal "c" is used for generating the pulse signals "d" and "e" on the basis of the pulse signals "a" and "b."

Bringing the pulse signal "d" Low turns on the p-channel MOSFET Q1 of the charge pump circuit 154 to charge up the capacitor 155. Driving the pulse signal "e" High turns on the n-channel MOSFET Q2 of the charge pump circuit 154 to discharge the capacitor 155. The charge and discharge operation causes the capacitor 155 to generate the voltage signal "f" correspondingly. The voltage signal "f" is smoothed by the low-pass filter 156 to generate the control voltage "g."

Because the delay gate circuits 222 have the same circuit structure as that of the delay gate circuits used by the ring oscillator 22, the relation between the control current Ix and the delay time tpx of the delay gate circuits is given by the expression (3) below using the same constant a0 as that in the expression (1) earlier:

$$tpx=1/(a0 \cdot Ix) \qquad (3)$$

Since the delay gate circuits 222 constitute a seven-stage delay circuit arrangement (#1–#7), the following expression (4) holds:

$$t1=7tpx \qquad (4)$$

During the time t1, the capacitor 155 is filled with an electric charge Qp through a pre-charge operation by the current source Ip. This raises the voltage "f" of the capacitor 155. During the time t2 [(1/fin)−t1], a charge Qd is released through a discharge operation by the current source Id. This lowers the voltage "f." The charges Qp and Qd are given by the following expressions (5) and (6):

$$Qp=t1 \cdot Ip \qquad (5)$$

$$Qd=t2 \cdot Id=[(1/fin)-t1] \cdot Id \qquad (6)$$

The low-pass filter 156 smoothes the voltage "f" to generate the control voltage "g." The voltage "g" is applied to the gate terminal of the n-channel MOSFET Q3 for conversion into the control current IM. The current mirror circuit generates the control current Ix in proportion to the current IM, whereby the delay time tpx of the delay gate circuits 222 is controlled.

When the current Ix is large, the delay time tpx is reduced as per the expression (3) above and the pre-charge time t1 is shortened according to the expression (4). This reduces the charge Qp and enhances the charge Qd as per the expression (6), thereby lowering the voltage "f" of the capacitor 155. The control voltage "g" generated by smoothing the voltage "f" is also lowered, which reduces the current IM. Conversely, when the current Ix is small, the delay time tpx is prolonged according to the expression (3) and the pre-charge time t1 is extended as per the expression (4). This in turn raises the charge Qp according to the expression (5) and lowers the charge Qd in accordance with the expression (6), thereby boosting the voltage "f" of the capacitor 155. The control voltage "g" derived from the smoothing of the voltage "f" is also raised, which enlarges the current IM.

Thus the circuit arrangement above constitutes a negative feedback loop that is balanced when the pre-charge Qp and the discharge Qd coincide with each other. When Qp=Qd in the expressions (5) and (6), then the following expression (7) holds:

$$1/fin=7 \cdot tpx \, [1+(Ip/Id)] \qquad (7)$$

The expression (7) signifies that the ratio of the cycle 1/fin of the timing signal CIN to the delay time tpx of the internal delay gate circuits 222 remains constant, and that the control current Ix satisfying the expression is generated in the negative feedback loop. Therefore the control current Ix is proportional to the frequency fin of the timing signal CIN in accordance with the expression (8) below based on the earlier expressions (7) and (3):

$$Ix=(7/a0)\cdot[1+(Ip/Id)]\cdot fin \tag{8}$$

When the compensation current Ic is generated in proportion to the control current Ix, the relation between the currents Ic and Ix is assumed to be Ic=a3·Ix. In that case, the expression (9) below is provided, which indicates a proportional relation between the compensation current Ic and the frequency fin of the timing signal CIN:

$$Ic=(7\cdot a3/a0)\cdot[1+(Ip/Id)]\cdot fin \tag{9}$$

Figure 8A:
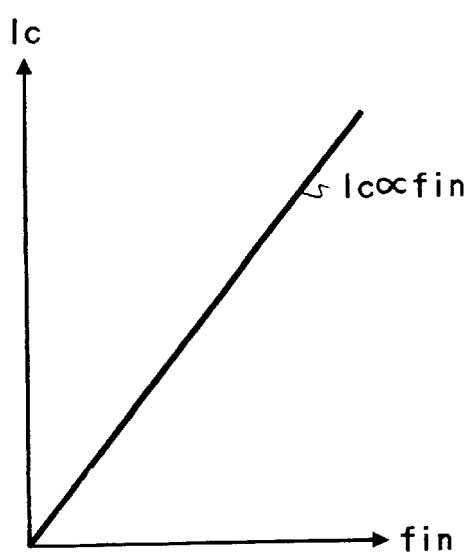
FIG. 8A is a graphic representation of a characteristic reflecting how the compensation circuit of FIG. 2 operates.
Figure 8B:
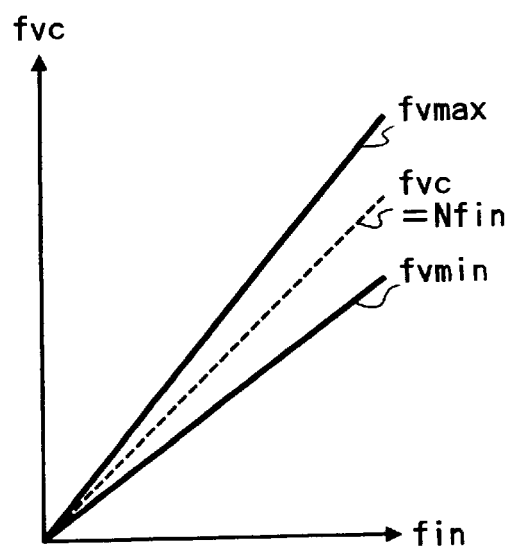
FIG. 8B is a graphic representation of PLL characteristics associated with the compensation circuit of FIG. 2.

FIGS. 8A and 8B are graphic representations of characteristics reflecting the workings of the compensation circuit and a PLL arrangement using it. FIG. 8A graphically depicts a characteristic of the compensation circuit 15, indicating that the compensation current Ic and the frequency fin of the timing signal CIN are proportional to each other. FIG. 8B is a graphic representation of PLL characteristics showing that the oscillation center frequency fvc generated by the VCO 13 is determined by the compensation current Ic of the compensation circuit 15. That is, with the control current Iv in the expression (2) above turning into the current I1 (=a1·Ic) of the voltage-current conversion circuit, the following expression (10) holds:

$$fvc=(7/18)\cdot a1\cdot a3\cdot[1+(Ip/Id)]\cdot fin \tag{10}$$

In the PLL setup in its phase-locked state, the frequency fin of the input timing signal CIN and the oscillation frequency fv of the VCO 13 take on the relation:

$$fv=N\cdot fin$$

where, N is the division ratio of the frequency divider 14 in the loop. Thus if the division ratio N is made the same as the proportional constant in the expression (10), as in the following expression (11):

$$N=(7/18)\cdot a1\cdot a3\cdot[1+(Ip/Id)] \tag{11}$$

then the frequency fv coincides with the frequency fvc.

In the expression (11), the values a1 and a3 are determined by the size ratio of the MOSFETs in the current mirror circuit, and the currents Ip and Id are also determined likewise by the size ratio of the MOSFETs in the current mirror circuit. Although there exist process-induced characteristic disparities between the MOSFETs of the VCO in this embodiment, their relative ratios are controlled with precision. This means that ultimately the disparities in characteristic are canceled out between the devices, whereby the VCO always operates stably in keeping with a wide range of frequencies of the timing signal CIN.

Figure 9:
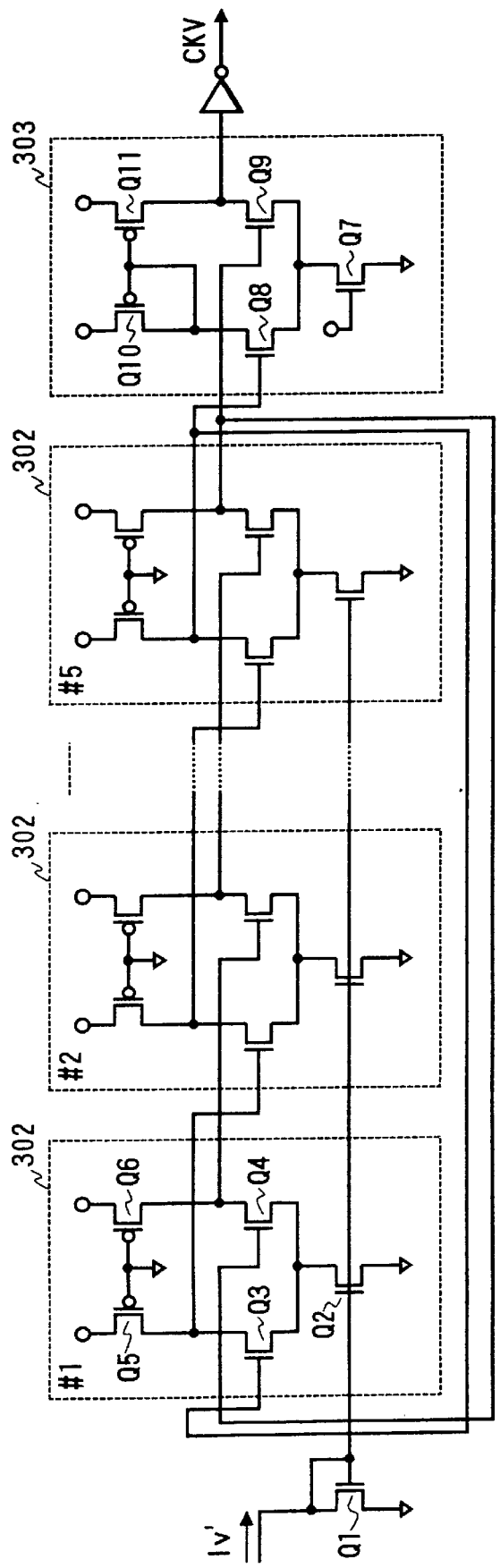
FIG. 9 is a circuit diagram of an alternative ring oscillator constituting part of the VCO in the inventive clock pulse generator.

FIG. 9 is a circuit diagram of an alternative ring oscillator constituting part of the VCO in the inventive clock pulse generator. In the above-described embodiment involving CMOS inverter circuits, the signal amplitude involved is affected by the fluctuation in the supply voltage. That is, oscillation frequency is vulnerable to supply voltage fluctuation. This alternative embodiment, by contrast, utilizes a differential gate circuit arrangement to be described below. Although the circuit symbols representing the circuit elements of the circuit in FIG. 9 are identical to those in the preceding embodiment, the new elements should be understood to have different circuit functions. The same holds for the circuit elements in FIG. 10.

A control current Iv' is fed to an n-channel MOSFET Q1 of diode form. The MOSFET Q1 is in current mirror relation to an n-channel current source MOSFET Q2 generating the operating current of a differential gate circuit 302, shown illustratively in FIG. 9. The drain terminal of the MOSFET Q2 is connected to the common source terminal of n-channel differential MOSFETs Q3 and Q4. Between the drain terminal of the differential MOSFETs Q3 and Q4 on the one hand and the supply voltage on the other are p-channel MOSFETs Q5 and Q6 furnished as load resistors. The p-channel MOSFETs Q5 and Q6 act as resistor elements when supplied with a grounding potential through their gate terminals.

The differential gate circuits 302 constitute a ring oscillator having five differential gate circuits (#1–#5) connected in a ring-like manner. In operation, complementary output signals of the first-stage differential gate circuit are fed to the gate terminals of differential MOSFETs in the next-stage differential gate circuit (#2) whose complementary output signals are in turn forwarded to the differential input terminals of the next-stage circuit, and so on. Inside the ring oscillator constitution, in short, the complementary output signals of each differential gate circuit are fed successively to the differential input terminals of the next-stage circuit. A reduced signal amplitude involved with the complementary signal transmission makes it possible to minimize the effects of fluctuations in the supply voltage.

In this alternative embodiment, the complementary output signals of the fifth-stage differential gate circuit (#5) are fed back to the first-stage differential gate circuit (#1) and are also sent to an output differential circuit 303. In the output differential circuit 303, the complementary output signals are input to the gate terminals of differential MOSFETs Q8 and Q9. Between the common source terminal of the differential MOSFETs Q8 and Q9 on the one hand and the grounding potential on the other is an n-channel MOSFET Q7 acting as a current source. The drain terminals of the MOSFETs Q8 and Q9 are connected to a current mirror circuit which comprises p-channel MOSFETs Q10 and Q11 and which serves as an active load circuit. This setup generates a single-ended amplified output signal, effecting the output of a CMOS-level oscillation signal CKV via a CMOS inverter circuit furnished in the output stage.

Figure 10:
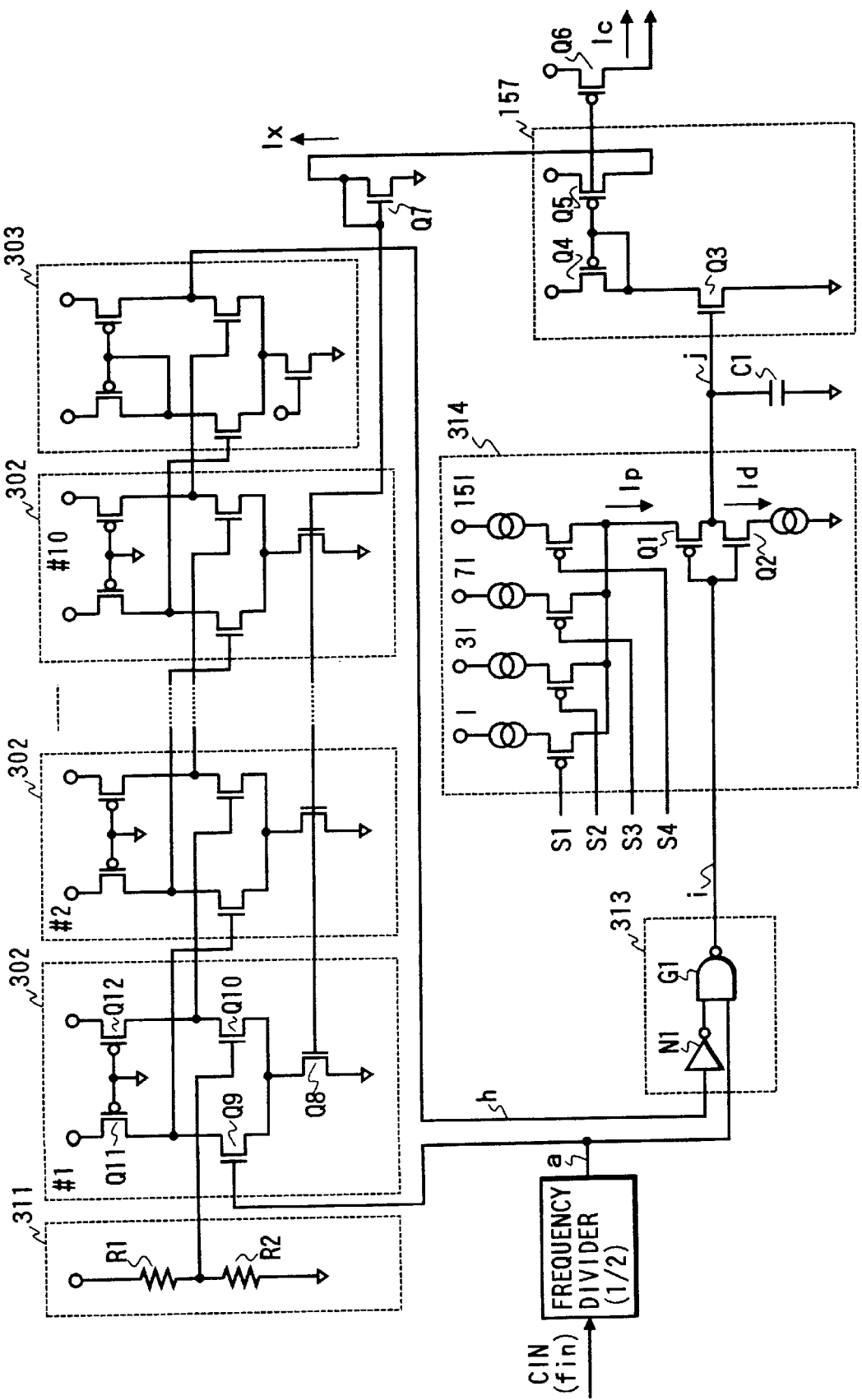
FIG. 10 is a circuit diagram of a typical compensation circuit corresponding to the ring oscillator of FIG. 9.
Figure 11:
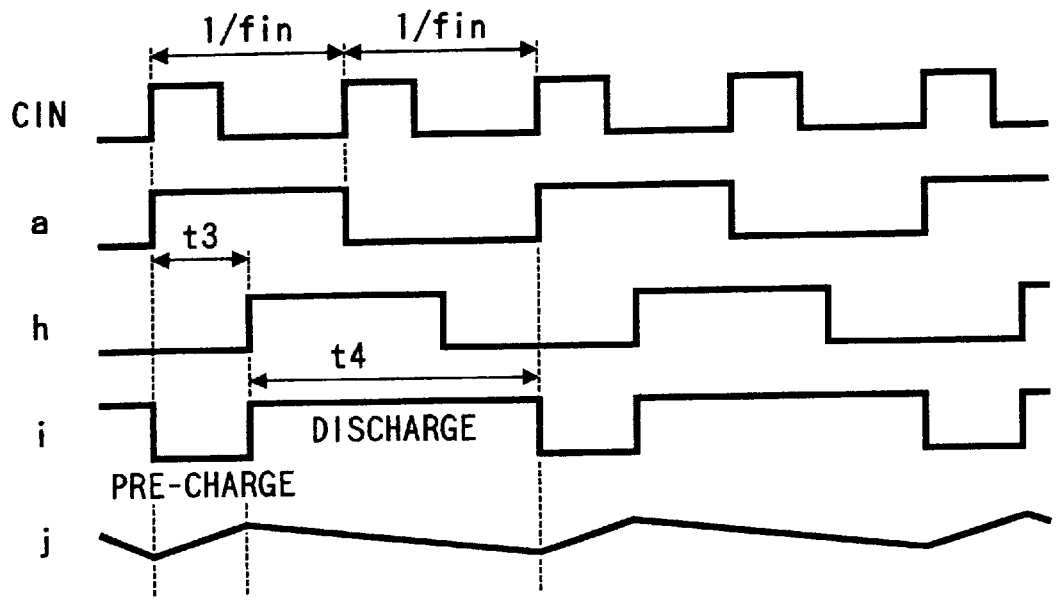
FIG. 11 is a waveform diagram for explaining how the compensation circuit of FIG. 10 operates.

FIG. 10 is a circuit diagram of a typical compensation circuit corresponding to the ring oscillator of FIG. 9, and FIG. 11 is a waveform diagram for explaining how the compensation circuit of FIG. 10 operates. As with the preceding embodiment, the timing signal CIN is halved by a ½ frequency divider. With the pulse width duty factor cut by 50%, the original timing signal is converted to a pulse signal "a" and admitted into the compensation circuit. The pulse signal "a" is delayed by the different gate circuits 302 constituting a current-controlled delay circuit the same in structure as that of the above-described ring oscillator. Specifically, a delay signal "h" of the pulse signal "a" is output via the current-controlled delay circuit comprising 10 differential gate circuits 302 (#1–#10) and via the differential output circuit 303. The pulse signals "h" and "a" both enter a logic circuit 313 made up of a NAND gate G1 and an inverter circuit N1. The logic circuit 313 outputs a pulse signal "i." The pulse signal "i" is brought Low during a delay time t3 of the delay circuit, and is driven High during a time t4 given by subtracting the above delay time (t3) from two cycles of the timing signal CIN (1/fin+1/fin).

That is, the logic circuit 313 brings Low the pulse signal "i" in keeping with the delay time t3 in one cycle (1/fin) of the timing signal CIN. This turns on the p-channel MOSFET Q1 of a charge pump circuit 314, causing the constant current source Ip to charge up a capacitor C1. The logic circuit 313 then drives High the pulse signal "i" in accordance with the remaining time t4 within the two cycles of the timing signal CIN. This turns on the n-channel MOSFET Q2 of the charge pump circuit 314, causing the constant current source Id to discharge the capacitor C1.

A voltage signal "j" from the capacitor C1 is supplied between the gate and source terminals of the n-channel MOSFET Q3, and is converted to a current signal via the drain terminal thereof. This current signal is separated into two outputs by a current mirror circuit made up of p-channel MOSFETs Q4, Q5 and Q6. One separated output is the control current Ix sent to the delay circuit via the MOSFET Q5; the other output is the compensation current Ic forwarded to the VCO via the MOSFET Q6.

The control current Ix is used to control the operating current of the differential gate circuits by way of a current mirror circuit including n-channel MOSFETs Q7 and Q8, similar to those of the ring oscillator in FIG. 2. In this example comprising the differential gate circuits, the first-stage differential gate circuit (#1) is supplied with the pulse signal "a" through the gate terminal of the differential MOSFET Q9 and is fed with a mid-point voltage generated by a bias circuit 311 composed of resistors R1 and R2. From the second-stage circuit (#2) through the last-stage circuit (#10), the complementary output signals are sent successively downstream from one stage to the next as in the ring oscillator. The output signals of the last-stage circuit (#10) are converted by the differential output circuit 303 to a single-ended signal for transmission to the logic circuit 313. The inverter circuit N1 in the logic circuit 313 doubles as a level converter for converting the output signal of the differential output circuit 303 into a CMOS level.

The differential gate circuit (#1) delays the input signal in such a manner that the operating current generated by the MOSFET Q8 is switched between the differential MOSFETs Q9 and Q10 to discharge the capacitive load consisting of the gate and line capacities of the next-stage circuit. When the operating current generated by the MOSFET Q8 is varied in accordance with the control current Ix flowing through the MOSFET Q7 in current mirror relation to the Q8, the differential gate circuit operates as a current-controlled delay circuit.

The delay time tpx of the differential gate circuit 302 is controlled by the control current Ix so as to keep constant the ratio of the cycle (1/fin) of the timing signal CIN to the delay time t3 given by the delay circuit. The compensation current Ic is generated to correspond with the cycle of the timing signal CIN, i.e, the frequency fin. At this point, when the frequency fin is made high, the control current Ix and compensation current Ic are both enlarged so as to shorten the cycle (1/fin) and reduce the delay time tpx of the differential gate circuit 302. Conversely, when the frequency fin is made low, the control current Ix and compensation current Ic are both reduced in order to prolong the cycle (1/fin) and extend the delay time tpx of the differential gate circuit 302. In this manner, the compensation circuit converts the frequency of the input signal CIN to current signals.

The compensation current Ic is used by the voltage-current conversion circuit of FIG. 5 to determine the center frequency fvc of the ring oscillator acting practically as the VCO. Because the delay gate circuit for practically performing frequency-current converting operations and the delay gate circuit for determining the oscillation frequency of the ring oscillator are structurally the same within the compensation circuit, the control currents Ix and Iv maintain a virtually constant relation to each other without being affected by process-induced disparities in device characteristics.

In this example, the charge pump circuit 314 is equipped with an additional function. That is, the constant current source Ip for charging the capacitor C1 is switched relative to the current I by selectively driving Low control signals S1 through S4. The resulting current may be three times, seven times or 15 times the current I allowed to flow. In the PLL setup in its phase-locked state, the relation between the frequency fin of the input timing signal CIN and the oscillation frequency fv of the VCO 13 is determined by the division ratio N of the frequency divider 14 within the loop. When the ratio N is changed, the control signals S1 through S4 are used to change correspondingly the ratio of the current Ip to the current Id so that the above expression (11) will hold. The control signals S1 through S4 may be supplied from the external terminal of the semiconductor integrated circuit incorporating the clock pulse generator of the invention. Alternatively, the control signals S1 through S4 may be generated in keeping with the change in the division ratio N before they are fed to the charge pump circuit 314.

Figure 12:
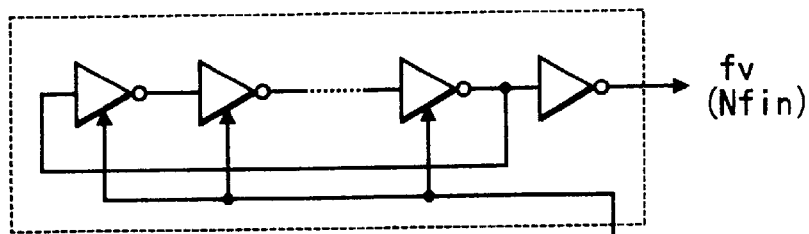
FIG. 12 is a schematic circuit diagram of an alternative clock pulse generator embodying the invention.
Figure 12:
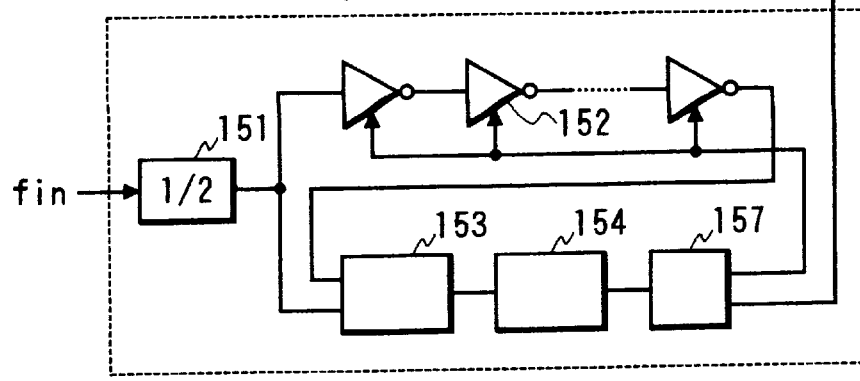

FIG. 12 is a schematic circuit diagram of an alternative clock pulse generator embodying the invention. This alternative embodiment is a circuit that acquires a timing signal by simply multiplying the frequency of an externally supplied timing signal entered through an external terminal. Unlike the PLL setup involving the phase-locked state, this embodiment is a frequency multiplier for generating a timing signal whose frequency is simply raised by a predetermined rate.

This embodiment is constituted by combining the compensation circuit with the ring oscillator both described above. In operation, the control current generated by the compensation circuit in the embodiment of FIG. 1 is used to control the ring oscillator type current-controlled oscillation circuit. This embodiment, as per the expression (10) above, allows a multiplied internal frequency signal fv to be obtained with ease. The internal frequency signal fv is fed illustratively to a charge pump circuit constituting an internal step-up power circuit that provides a raised voltage in a stable manner at a frequency higher than that of the clock pulse signal supplied through the external terminal. The embodiment also applies to varieties of clock pulse generators that require a multiplied pulse signal based on the externally supplied clock pulses from the outside.

Figure 13:
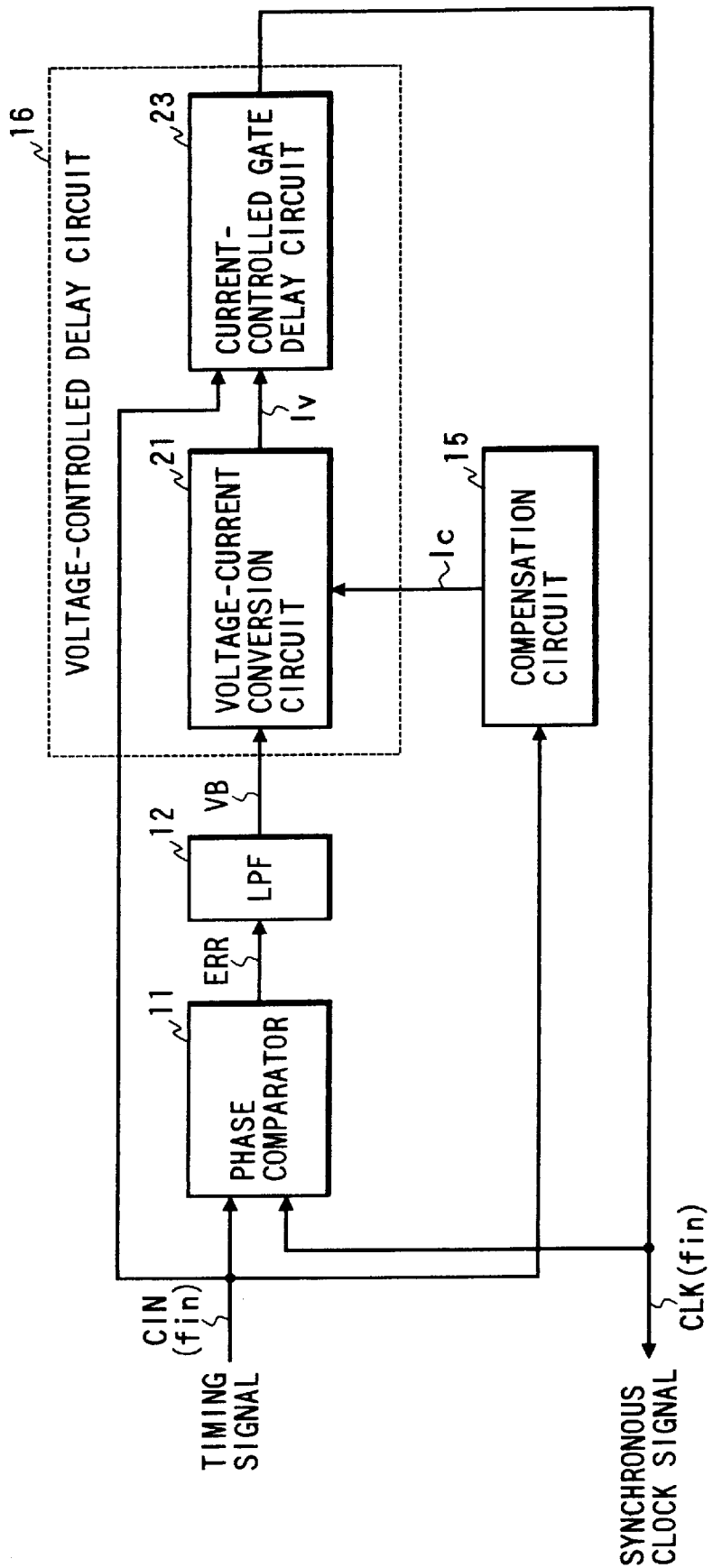
FIG. 13 is a block diagram of another alternative clock pulse generator embodying the invention.

FIG. 13 is a block diagram of another alternative clock pulse generator embodying the invention. This alternative embodiment generates a synchronizing clock signal whose frequency is the same as that of a timing signal supplied through an external terminal and whose phase is in synchronism with that of the latter signal. Specifically, the embodiment generates an internal synchronizing signal delayed by one cycle relative to the externally supplied timing signal. In a basic constitution, the frequency divider inserted in the PLL setup of FIG. 1 is omitted therefrom, and the compensation circuit 15 and a current-controlled gate delay circuit 23 take the place of the ring oscillator 22.

With this embodiment, when the frequency of the timing signal CIN is changed, the basic delay time of the signal is set by the compensation circuit 15. A phase comparator 11 detects an error signal ERR (i.e., phase difference) between the delay time and the timing signal. The error signal ERR is converted by a low-pass filter 12 into a voltage signal VB for fine-tuning the current-controlled gate delay circuit 23. In turn, the output signal CLK of the current-controlled gate delay circuit 23 receiving the externally supplied timing signal CIN becomes a synchronizing clock signal that is delayed relative to the timing signal CIN for precise synchronism therewith. In this setup, as in the preceding embodiment, the current-controlled delay circuit used by the compensation circuit 15 is the same in structure as the current-controlled gate delay circuit 23 for delaying the input signal CIN. Thus even where the input signal CIN is set for an extensive range of frequencies, the synchronizing clock signal CLK is arranged to follow the input signal precisely for synchronism therewith.

Figure 14:
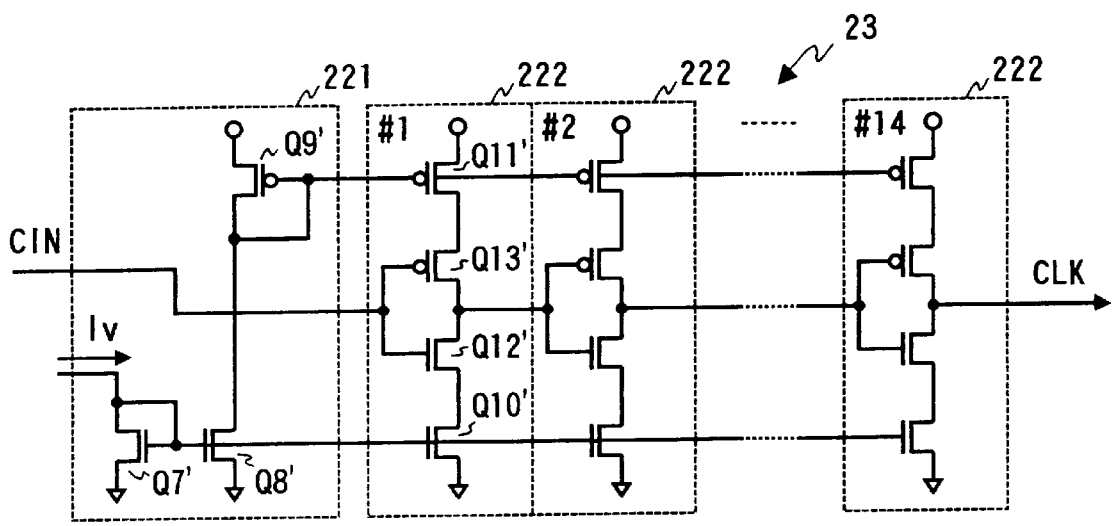
FIG. 14 is a circuit diagram of a typical current-controlled gate delay circuit included in FIG. 13.

FIG. 14 is a circuit diagram of a typical current-controlled gate delay circuit 23. In a basic constitution, a plurality of delay gate circuits 222 are connected serially in the same manner as in the ring oscillator of FIG. 2. The only difference between the current-controlled gate delay circuit 23 of FIG. 14 and the ring oscillator of FIG. 2 is that in the circuit 23, the output signal of the last-stage delay gate circuit 222 (#14) is not fed back to the first-stage delay gate circuit 222 (#1).

Figure 15A:
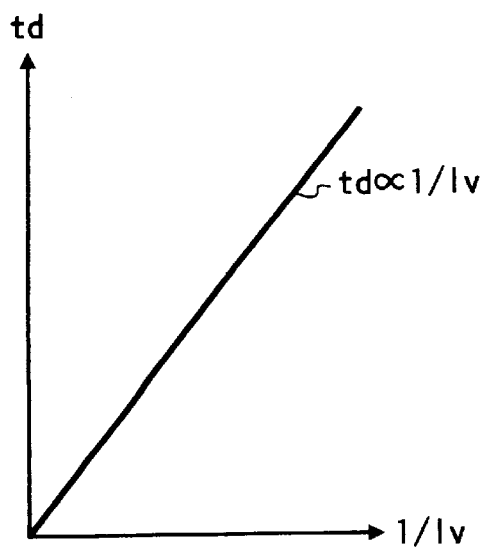
FIG. 15A is a graphic representation of a 1/Iv-td characteristic reflecting how the current-controlled gate delay circuit of FIG. 13 operates.
Figure 15B:
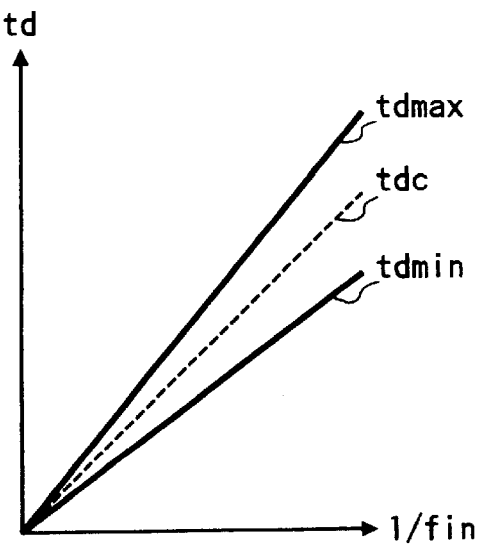
FIG. 15B is a graphic representation of a 1/fin-td characteristic reflecting how the current-controlled gate delay circuit of FIG. 13 operates.

FIGS. 15A and 15B are graphic representations of characteristics reflecting how the current-controlled gate delay circuit 23 operates. FIG. 15A illustrates a typical relation between the delay time td and a control current 1/Iv in inverse proportion thereto. As discussed above, the delay time td is inversely proportional to the control current Iv. FIG. 15B shows a center delay time tdc of the compensation circuit versus a maximum delay time tdmax and a minimum delay time tdmin corresponding to the phase difference ERR detected by the phase comparator. FIG. 15B corresponds to the characteristic view of FIG. 8B.

In this embodiment, as in the preceding embodiment, the relation between the delay time tdc and the cycle (1/fin) of the timing signal is determined by the size ratio of the MOSFETs in the current mirror circuit. Although there exist process-induced characteristic disparities between the MOSFETs in this embodiment, their relative ratios are controlled with precision. This means that ultimately the disparities in characteristic are canceled out between the devices, whereby the current-controlled gate delay circuit always operates stably in keeping with a wide range of frequencies of the timing signal CIN.

As described, the clock pulse generator of the invention keeps the operating point of its internal circuits independent of the change in the frequency fin of the input timing signal CIN as well as of the process-induced characteristic disparities. This enlarges the available range of operating frequencies. The fact that the above-described compensation circuit is provided or that the variable delay range of the delay circuit can be narrowed prevents a false synchronism. That is, where the delay time td of the delay circuit is out of step with the cycle (1/fin) of the timing signal CIN, the two are prevented from getting inadvertently synchronized when the delay time is twice or a higher natural number of times the cycle.

Figure 16A:
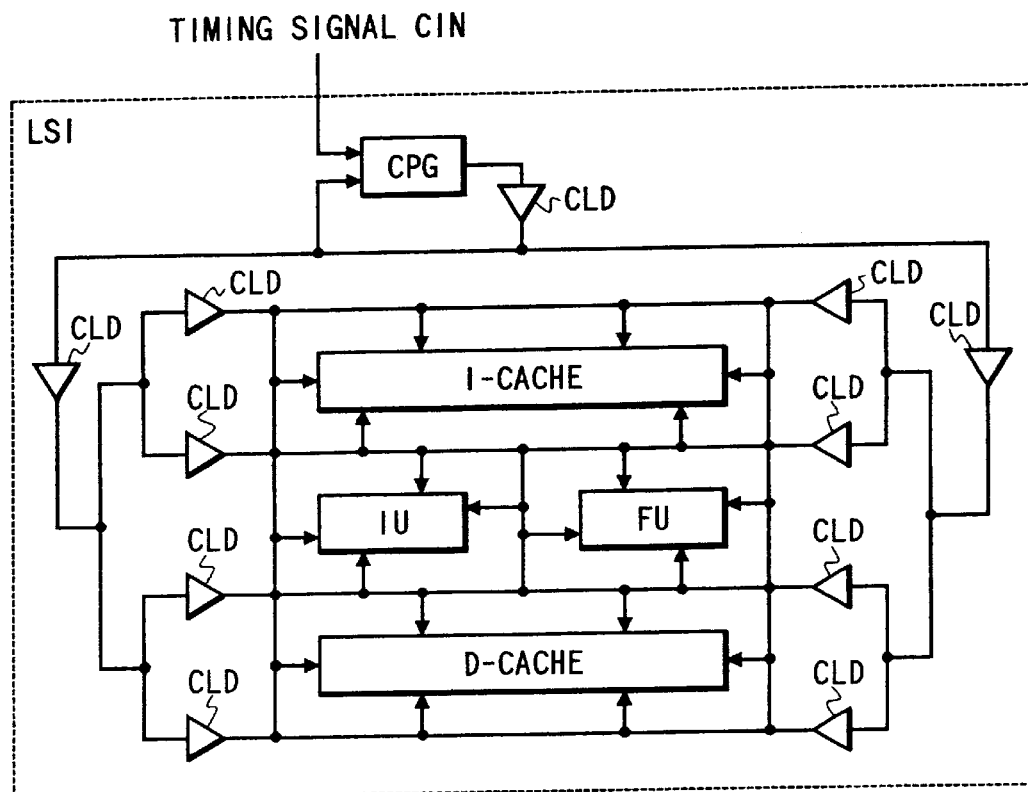
FIG. 16A is a block diagram of a typical information processing system incorporating the inventive clock pulse generator.

FIG. 16A is a block diagram of a typical information processing system incorporating the inventive clock pulse generator. This information processing system is a RISC type processor comprising a single semiconductor integrated circuit device LSI ((chip) indicated by broken line in FIG. 16A.

The clock pulse generator CPG is based on the PLL described earlier. In FIG. 16A, reference characters I-CACHE stand for an instruction cache memory for holding a program, D-CACHE for a data cache memory for accommodating data, IU for an integer operation unit, and FU for a floating-point operation unit.

Clock pulse signals generated by the clock pulse generator CPG above are distributed by clock drivers CLD throughout the chip and fed to the internal circuits therein. In this setup, the number of clock drivers is arranged to be the same on each of the signal transmission paths from the clock pulse generator CPG to the respective internal circuits, and the transmission paths are arranged to have virtually the same line length each. The arrangement is intended to reduce the skew between the clock pulse signals inside. The outputs of the last-stage clock drivers are interconnected (i.e., short-circuited) so as to absorb signal delay disparities over the clock signal distribution paths including the clock drivers.

Figure 16B:
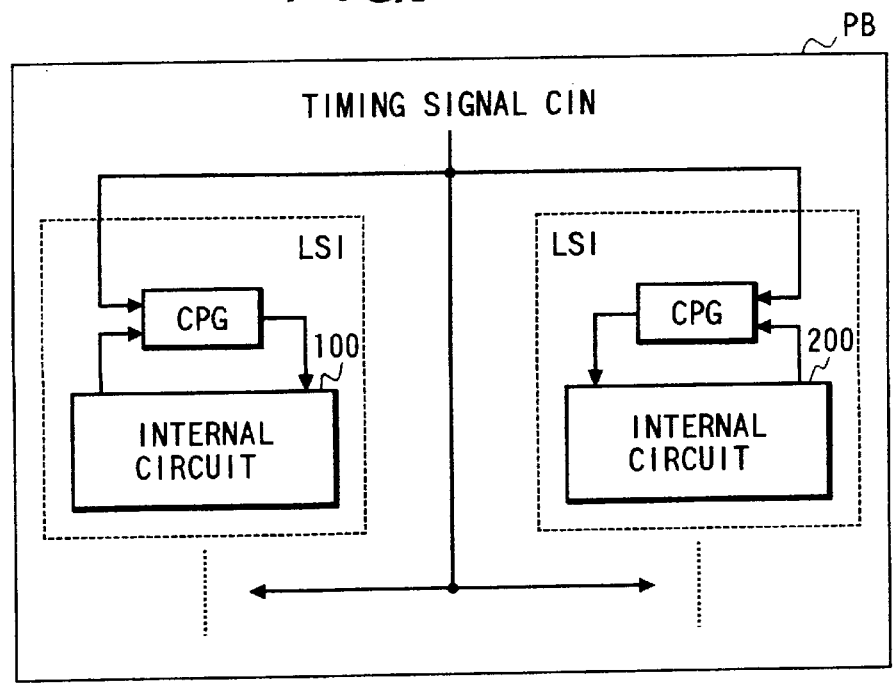
FIG. 16B is a block diagram of a setup comprising a plurality of units of the information processing system in FIG. 16A, formed on a substrate.

The clock pulse generator CPG generates internal clock signals in such a manner that the reference internal clock pulses for each of the circuits within the chip are synchronized with the externally supplied timing signal CIN. This eliminates the need to allow for the delay time of the clock drivers when a plurality of semiconductor integrated circuit devices (LSI chips) mounted on the same substrate PB are to be synchronized, as shown in FIG. 16B. As discussed, the clock pulse generator CPG operates stably given the change in the frequency of the timing signal CIN or the process-induced characteristic disparities. This means that there is no need to add more processes or to implement special measures for controlling the process-induced characteristic disparities in preparation for incorporating the PLL setup. Internal circuits 100 and 200 in FIG. 16B each include, and are not limited to, the instruction cache memory I-CACHE, date cache memory (D-CACHE), integer operation unit IU and floating-point operation unit FU shown in FIG. 16A.

The clock pulse generator CPG of this invention generates with precision internal clock pulse signals in response to an extensive range of frequencies of the timing signal CIN. This feature may be taken advantage of in normal operation to distribute clock signals of relatively low frequencies corresponding to the clock frequency over the signal lines on the substrate comprising the multiple semiconductor integrated circuit devices. In that case, each semiconductor integrated circuit device may be run at high speed on a high-frequency internal clock signal exceeding the upper limit of the frequency transmitted over the signal lines in keeping with the division ratio of the PLL.

In development and design stages, the processors incorporating the above clock pulse generator and their peripheral circuits may be run on a clock signal whose frequency is drastically lowered from the normal operating frequency. This arrangement simplifies circuit debugging procedures. In such cases, the frequency of the timing signal CIN is simply lowered as desired. It is then possible simply to carry out sequential circuit operation checks by significantly lowering the internal clock frequency without the use of a conventional clock input terminal for debugging purposes.

Major benefits offered by the above-described embodiments of the invention are summarized as follows:

(1) A first frequency signal fed from the external terminal of the semiconductor integrated circuit and a second frequency signal generated within the semiconductor integrated circuit are input to a phase comparator. The output signal of the phase comparator is smoothed by a low-pass filter for conversion to a voltage signal. A compensation circuit uses both a delay signal from a current-controlled delay circuit receiving the first frequency signal and the first frequency signal to generate a current signal corresponding to the frequency of the latter signal. The voltage signal generated by the low-pass filter is converted into a current signal. This current signal is combined with the current signal from the compensation circuit to control the oscillation frequency of a ring oscillator comprising a current-controlled delay circuit the same in structure as the above current-controlled delay circuit. On the basis of the oscillation signal from the ring oscillator, the second frequency signal and clock signals needed in the semiconductor integrated circuit are generated. In the clock pulse generator of the above constitution, the ring oscillator located in the PLL setup employs the current-controlled delay circuit of the same structure as that in the compensation circuit for controlling the operating range of the ring oscillator. The constitution provides enhanced compatibility between the component circuits and thus drastically reduces process-induced characteristic disparities between the generator components. This makes it possible for the inventive clock pulse generator to utilize circuits as structurally simple as CMOS circuits.

(2) Each of the delay circuits constituting the current-controlled delay circuit and ring oscillator includes a CMOS inverter circuit composed of a first p-channel MOSFET and a first n-channel MOSFET for allowing the control current to flow therethrough, and of a second p-channel MOSFET and a second n-channel MOSFET for allowing the operating current to flow therethrough between the first p-channel MOSFET and the first n-channel MOSFET. The CMOS inverter circuits constitute a CMOS integrated circuit that may be fabricated by relatively simple manufacturing processes.

(3) Each of the delay circuits constituting the current-controlled delay circuit and ring oscillator includes a differential gate circuit constituted by a first-conductivity type first MOSFET for allowing the control current to flow therethrough, by a first-conductivity type second MOSFET and a first-conductivity type third MOSFET having source terminals connected commonly to the drain terminal of the first-conductivity type first MOSFET, and by a second-conductivity type first MOSFET and a second-conductivity type second MOSFET which are connected to the drain terminals of the first-conductivity type second MOSFET and the first-conductivity type third MOSFET and which function as load elements. This arrangement reduces supply voltage dependency to provide more stable operation.

(4) The delay signal of the current-controlled delay circuit and the first frequency signal are converted to a current signal corresponding to the phase difference therebetween. The current signal is used to control the delay time in such a manner that the delay signal will have a predetermined phase difference relative to the first frequency signal. This arrangement readily provides circuit compatibility between the compensation circuit on the one hand and the PLL circuit controlled thereby or a delay line type PLL on the other.

(5) The ring oscillator is controlled by a compensation circuit and a delay circuit. The compensation circuit uses both the delay signal from the current-controlled delay circuit receiving the first frequency signal and the first frequency signal to generate a control current corresponding to the frequency of the latter signal. The delay circuit is arranged to have the same structure as that of the current-controlled delay circuit. The ring oscillator arrangement, though structured so simply, still generates an internal clock signal whose frequency is multiplied with respect to the input signal.

(6) A frequency signal fed from the external terminal of the semiconductor integrated circuit and a delay signal of that frequency signal are input to a phase comparator. The output signal of the phase comparator is smoothed by a low-pass filter for conversion to a voltage signal. A compensation circuit uses both a delay signal from a first current-controlled delay circuit receiving the frequency signal and the frequency signal to generate a current signal corresponding to the frequency of the latter signal. The voltage signal generated by the low-pass filter is converted into a current signal. This current signal is combined with the current signal from the compensation circuit to control a second current-controlled delay circuit the same in structure as the above first current-controlled delay circuit. On the basis of the delay signal from the second current-controlled delay circuit, the clock signals needed in the semiconductor integrated circuit and the delay signal entered into the phase comparator are generated. Because the second current-controlled delay circuit for generating the internally required clock signals is identical in structure to the compensation circuit for controlling the operating range of that circuit in this constitution, the compatibility between the circuit components is enhanced and the process-induced characteristic disparities therebetween are drastically reduced. This makes it possible to utilize circuits as simply structured as CMOS circuits.

Although the description above contains many specificities, these should not be construed as limiting the scope of the invention but as merely providing illustrations of the presently preferred embodiments of this invention. It is evident that many alternatives, modifications and variations will become apparent to those skilled in the art in light of the foregoing description. For example, the low-pass filter 156 may be omitted from the setup in FIG. 4. Conversely, in the example of FIG. 10, a low-pass filter may be added downstream of the capacitor C1. With respect to the charge pump circuit in the example of FIG. 10, the charge current Ip may be fixed as in the example of FIG. 4. Conversely, the charge current Ip in the example of FIG. 4 may be made switchable as in the example of FIG. 10. The frequency divider upstream of the compensation circuit may be omitted if the pulse width duty factor of the timing signal is 50%. The number of successively connected circuits in the ring oscillator or in the current-controlled gate delay circuit, and the number of current-controlled delay circuits for generating the compensation current may be varied as needed.

The clock pulse generator according to the invention is thus applied extensively to varieties of circuits for generating internal clock signals corresponding to the frequency of an externally supplied timing signal coming via an external terminal.

What is claimed is:

1. A clock pulse generator formed in a semiconductor integrated circuit on a semiconductor substrate, said clock pulse generator comprising:

a phase comparator which detects a phase difference between a timing signal fed from an external terminal of said semiconductor integrated circuit and a clock signal generated within said semiconductor integrated circuit, and which outputs an output signal corresponding to said phase difference;

a low-pass filter which smoothes the output signal of said phase comparator and which converts the output signal corresponding to said phase difference into a voltage signal;

a voltage-current conversion circuit which converts the voltage signal generated by said low-pass filter into a first current signal, and which generates a second current signal on the basis of said first current signal and a third current signal corresponding to the frequency of said timing signal;

a ring oscillator which is controlled by said second current signal, and which includes a first delay circuit that outputs said clock signal by generating a delay signal of said second current signal; and a compensation circuit which includes a second delay circuit that generates a delay signal of said timing signal, and which generates said third current signal on the basis of the timing signal and the delay signal of said timing signal, wherein each of said first and the second delay circuit includes serial-connected inverter circuits which delay the timing signal and said second current signal.

2. A clock pulse generator according to claim 1, wherein each of said serial-connected inverter circuits includes a first p-channel MOSFET and a first n-channel MOSFET, wherein gate terminals and drain terminals of said first p-channel MOSFET and said first n-channel MOSFET are commonly connected, respectively; and wherein the commonly connected drain terminals are connected to commonly connected gate terminals of the next-downstream one of said serial-connected inverter circuits.

3. A clock pulse generator according to claim 1, further comprising:

a frequency divider which receives said clock signal from said first delay circuit, and which divides said clock signal by a predetermined division ratio, wherein the divided clock signal is supplied to a memory circuit coupled to the clock pulse generator.

4. A clock pulse generator according to claim 1, wherein each of said first and second delay circuits includes a differential gate circuit having a first conductivity type first MOSFET which allows said second current signal to flow therethrough, having a first conductivity type second MOSFET and a first conductivity type third MOSFET having source MOSFET terminals connected commonly to the drain terminal of said first conductivity type first MOSFET, and having a second conductivity type first MOSFET and a second conductivity type second MOSFET which are connected to the drain terminals of said first conductivity type second MOSFET and said first conductivity type third MOSFET and which function as load elements.

5. A processor formed as a semiconductor integrated circuit on a semiconductor substrate having a clock pulse generator, a memory circuit and an operation unit, said clock pulse generator comprising:

a phase comparator which detects a phase difference between a timing signal fed from an external terminal of said clock pulse generator and a clock signal generated within said clock pulse generator, and which outputs an output signal corresponding to said phase difference;

a low-pass filter which smoothes the output signal of said phase comparator and which converts the output signal corresponding to said phase difference into a voltage signal;

a voltage-current conversion circuit which converts the voltage signal generated by said low-pass filter into a first current signal, and which generates a second current signal on the basis of said first current signal and a third current signal corresponding to the frequency of said timing signal;

a ring oscillator which is controlled by said second current signal, and which includes a first delay circuit that outputs said clock signal by generating a delay signal of said second current signal; and a compensation circuit which includes a second delay circuit that generates a delay signal of said timing signal, and which generates said third current signal on the basis of the timing signal and the delay signal of said timing signal, wherein each of said first and the second delay circuits includes serial-connected inverter circuits which delay the timing signal and said second current signal, and wherein each of said memory circuit and said operation unit operates on the basis of said clock signal generated by said clock pulse generator.

6. A processor according to claim 5, wherein said memory circuit stores a program and/or data, and said operation, unit operates by use of the program and/or data.

7. A processor according to claim 5, wherein each of said serial-connected inverter circuits includes a first p-channel MOSFET and a first n-channel MOSFET, wherein gate terminals and drain terminals of said first p-channel MOSFET and said first n-channel MOSFET are commonly connected, respectively; and wherein the commonly connected drain terminals are connected to commonly connected gate terminals of the next-downstream one of said serial-connected inverter circuits.

8. A processor according to claim 6, further comprising:

a frequency divider which receives said clock signal from said first delay circuit, and which divides said clock signal by a predetermined division ratio, wherein the divided clock signal is supplied to said memory circuit and said arithmetic unit.

9. A processor according to claim 5, wherein each of said first and second delay circuits includes a differential gate circuit having a first conductivity type MOSFET which allows said second current signal to flow therethrough, having a first conductivity type second MOSFET and a first conductivity type third MOSFET having source MOSFET terminals connected commonly to the drain terminal of said first conductivity type first MOSFET, and having a second conductivity type first MOSFET and a second conductivity type second MOSFET which are connected to the drain terminals of said first conductivity type second MOSFET and said first conductivity type third MOSFET and which function as load elements.

* * * * *